United States Patent [19]
Zirwick

[11] 4,325,023
[45] Apr. 13, 1982

[54] DEVICE FOR INSPECTING AN INDIVIDUAL HIGH FREQUENCY SIGNAL SELECTED ACCORDING TO FREQUENCY FROM A BROAD FREQUENCY BAND

[75] Inventor: Kurt Zirwick, Greifenberg, Fed. Rep. of Germany

[73] Assignee: Rohde & Schwarz GmbH & Co KG, Fed. Rep. of Germany

[21] Appl. No.: 137,895

[22] Filed: Apr. 7, 1980

[30] Foreign Application Priority Data

Apr. 7, 1979 [DE] Fed. Rep. of Germany ....... 2914143

[51] Int. Cl.$^3$ ............................................. G01R 23/16
[52] U.S. Cl. ................................. 324/77 B; 324/77 C
[58] Field of Search ............ 364/518, 485; 324/77 R, 324/77 B, 77 C, 77 CS

[56] References Cited

U.S. PATENT DOCUMENTS

| | | | |
|---|---|---|---|
| 3,643,126 | 2/1972 | Hay | 324/77 C |
| 3,978,403 | 8/1976 | Mansfield | 324/77 B |
| 3,992,666 | 11/1976 | Edwards | 324/77 B |
| 4,118,666 | 10/1978 | Bernstein | 324/77 B |
| 4,238,727 | 12/1980 | Madni | 324/77 B |

*Primary Examiner*—Michael J. Tokar
*Attorney, Agent, or Firm*—Hill, Van Santen, Steadman, Chiara & Simpson

[57] ABSTRACT

A device for inspecting an individual high frequency signal selected according to frequency from a broad frequency band comprises a voltage controlled oscillator which can be controlled with respect to frequency by a periodic sweep voltage, in particular a linear sawtooth voltage, in such a manner that all signals occurring in the frequency band can be displayed as a spectrum in the picture screen of a cathode ray tube. The device further comprises a frequency marker generator which has a device for generating a frequency mark voltage and a voltage comparator for, given sweep operation and equality between an adjusted frequency marker voltage and a momentary sweep voltage, generating a frequency mark on the picture screen which is adjustable to identify a corresponding fixed frequency after termination of the sweep operation for inspecting an individual frequency-selected signal. The oscillator is a phase controlled oscillator of a synthesizer in whose control loop a transfer switch is provided and operates in such a manner that the sweep voltage switches off in a first position of the switch and the control loop is closed, and the momentary tuning voltage of the control loop is stored. Subsequently, the control loop is opened in a second switch position and the sweep voltage is connected to the control input of the oscillator. In this mode, the stored tuning voltage is compared to the sweep voltage in the voltage comparator of the frequency mark generator for generating the frequency mark. The transfer switch is held in the first switch condition for evaluating the individual signal.

10 Claims, 1 Drawing Figure

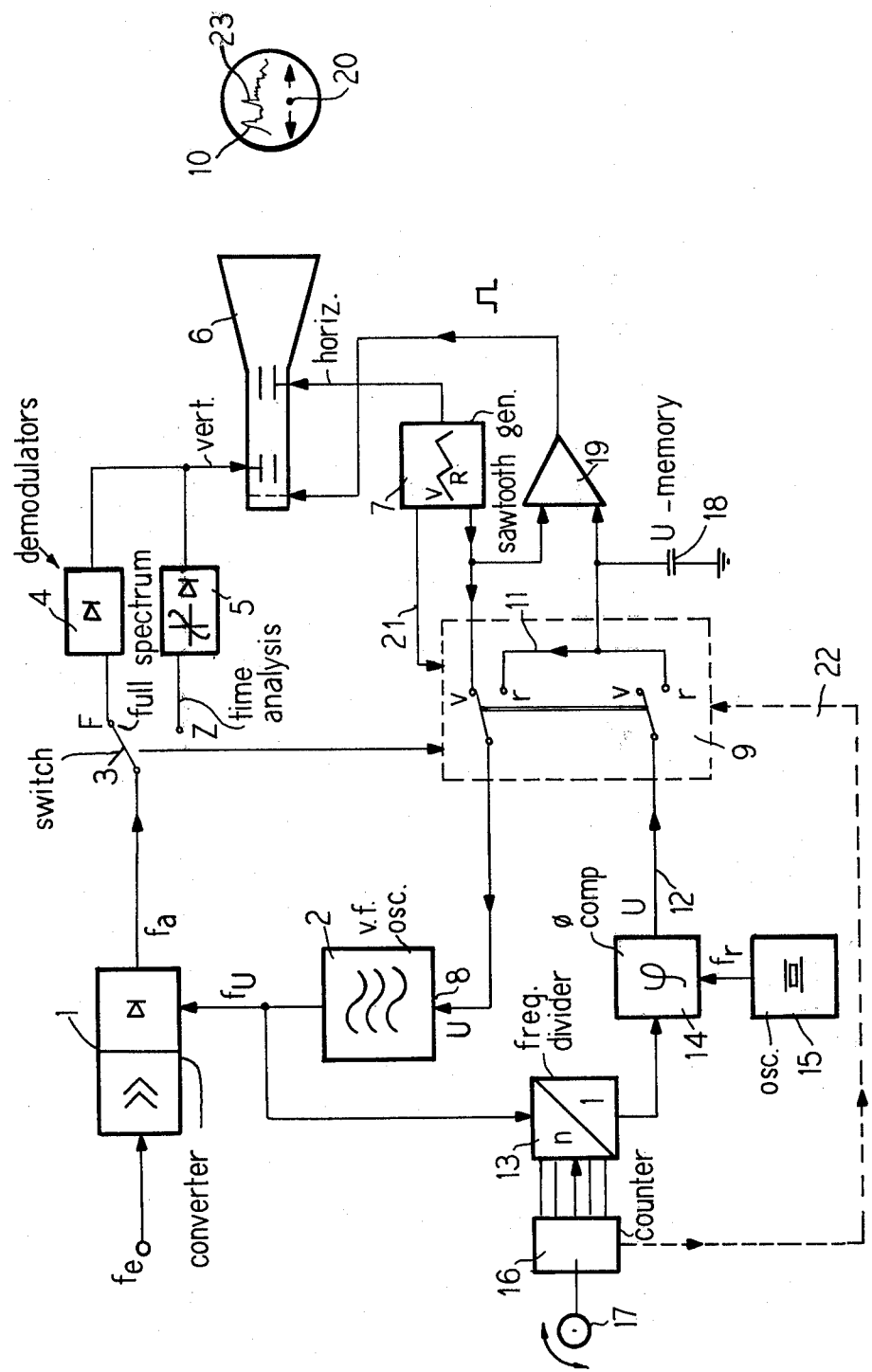

DEVICE FOR INSPECTING AN INDIVIDUAL HIGH FREQUENCY SIGNAL SELECTED ACCORDING TO FREQUENCY FROM A BROAD FREQUENCY BAND

BACKGROUND OF THE INVENTION

1. Field of the Invention

The present invention relates to a device for inspecting an individual frequency signal selected according to frequency from a broad frequency band comprising a voltage controlled oscillator which can be controlled in terms of frequency by a periodically repeating sweep voltage in such a manner that all signals occurring in the frequency band can be displayed on a spectrum basis on the picture screen of a cathode ray tube, and further comprising a frequency mark generator which comprises a device for generating a frequency mark voltage and a voltage comparator which, given sweep operation and equality between and adjusted frequency mark voltage and a momentary sweep voltage, a frequency mark can be generated on the picture screen, the frequency mark voltage providing tuning for an oscillator to the corresponding fixed frequency value after termination of the sweep operation for the purpose of inspecting an individual signal selected by the frequency mark.

2. Description of the Prior Art

A device of the type set forth above is known in the art, for example from the German Letters Patent No. 1,238,081. This device makes it possible, on the one hand, for a frequency analysis in which all signals occurring in a specific, wide frequency band are displayed, according to spectrum, on the display of a cathode ray tube, the display being provided by means of periodic sweep of the frequency band with a sweeping oscillator which is controlled in terms of its frequency course by means of a periodically repeating sweep voltage, for example, a linearly increasing sawtooth voltage. By means of a transfer, a time analysis is also possible with this device, given which time analysis an individual high frequency signal selected according to frequency from the frequency spectrum displayed in the frequency analysis is further inspected. The selection of the desired individual signal occurs by means of a frequency mark which is displaceable along the spectrum by an adjustment device and which can be brought into coincidence with the selected individual signal, namely a reference voltage is generated in the adjustment device and a keying pulse is generated by the reference voltage, the keying pulse being supplied to the display system in such a manner that the adjustable frequency mark generated by means of the keying pulse, for example, an intensification pip, is brought into coincidence with the selected individual signal of the spectrum to be inspected. The reference voltage of the adjustment device determined in that manner and corresponding to the frequency value of the individual signal to be inspected is supplied to the sweep oscillator after termination of the periodically repeating voltage course and the sweeping oscillator is thereby matched to the corresponding fixed frequency value of the selected individual signal.

In high frequency receiving devices, more and more synthesizers are being employed recently for frequency matching, for example, phase-control oscillators operating according to the analysis, or, respectively, indirect frequency synthesis method, in which oscillators a voltage-control, free-running oscillator is controlled by way of a phase control loop in which the output frequency of the oscillator, mixed or divided down, for example, by means of an adjustable frequency divider, is compared with a highly-constant reference frequency in a phase comparison element. By switching off the phase control loop, this free-running oscillator can be controlled in frequency by means of a corresponding drive with a sweep voltage and can thus be exploited as a sweeping oscillator. Given receivers equipped with such phase-locked loop synthesizers, there is no adjustment device which also emits a d.c. voltage corresponding to one of the momentary fixed frequency settings of the synthesizer during the sweep operation, as is the case, for example, of a potentiometer provided in the known devices set forth above, by means of whose voltage, on the one hand, the frequency marks are matched along the spectrum and, after shutdown of the voltage-control oscillator, are matched to the selected fixed frequency. In such synthesizers, given a closed phase control loop, a matching d.c. voltage for the oscillator is available in this loop, the matching voltage corresponding to the respectively set fixed frequency of the synthesizer; this voltage corresponds to the frequency adjustment, however, but is not available when the phase control loop is interrupted during the sweep operation, during which the oscillator is directly driven by way of a sawtooth voltage.

SUMMARY OF THE INVENTION

It is therefore the object of the present invention to provide a device in which the above-mentioned frequency and time analysis can be carried out with simple means, even with high frequency receiving devices, in which a synthesizer is provided as the sweeping or, respectively, receiving oscillator of the phase controlled oscillator.

Beginning with a device for inspecting an individual high frequency signal selected according to frequency from a broad frequency band, which comprises a voltage controlled oscillator which can be controlled in frequency by a periodically repeating sweep voltage, particularly a linearly increasing sawtooth voltage, in such a manner that all signals occurring in the frequency band can be displayed, according to spectrum, on the picture screen of the cathode ray tube, and comprising a frequency mark generator which includes a device for generating a frequency mark voltage and a voltage comparator, by means of which, given sweep operation and equality between an adjusted frequendcy mark voltage and a momentary sweep voltage, a frequency mark can be generated on the picture screen and by means of whose frequency mark voltage the oscillator can be tuned to the corresponding fixed frequency value after termination of the sweep operation for inspecting an individual signal selected by the frequency mark, the present invention is particularly characterized in that the oscillator is formed by the phase controlled oscillator of a synthesizer in whose control loop which leads to the control input of a controllable transfer device is arranged in such a manner that the sweep voltage turns off in a first switch position during a first part of the sweep voltage wave, the control loop is closed, and the momentary tuning voltage of the control loop is stored. Further, the control loop is separated in a second switch position during a second portion of the sweep voltage wave, the sweep voltage being connected to the control input of the oscillator instead, and the stored tuning voltage is compared to the sweep voltage in the voltage comparator of the frequency mark generator for the purpose of generating the frequency mark, and this transfer is held in the first switch position for the evaluation of the individual signal.

In accordance with the present invention, the tuning voltage, proportional to the respective frequency setting of the synthesizer, is exploited for generating the frequency mark, in particular after shutdown of the sweep operation it serves for matching the oscillator to the fixed frequency corresponding to the frequency mark. It is generated in segments of the periodic sweep wave in which the actual sweep display is not further disrupted, i.e. during the return of the sweep sawtooth voltage which is usually carried out with the retrace blanking or during every $n^{th}$ lead period given correspondingly high sweep frequencies at which such a short interruption of the actual sweep operation is of no further coincidence. During the short, periodic interruptions of the sweep operation, the phase control loop of the oscillator is closed by the transfer and the control voltage corresponding to the momentary frequency setting is then available, the control voltage now only requiring storage for comparison in a manner known per se to the sweep voltage during the subsequent re-engagement of the sweep operation in order to generate the frequency mark. Therefore, by a simple switch, any receiver equipped with a synthesizer as the tuning oscillator can be changed into a device for frequency analysis and time analysis of individual signals selected via precise frequency marks.

BRIEF DESCRIPTION OF THE DRAWINGS

Other objects, features and advantages of the invention, its organization, construction and operation will be best understood from the following detailed description, taken in conjunction with the accompanying drawing, on which there is a single FIGURE which is a schematic circuit diagram of a device constructed in accordance with the present invention.

DESCRIPTION OF THE PREFERRED EMBODIMENTS

Referring to the drawing, a basic circuit diagram of a standard, panorama receiver is illustrated having a receiving portion 1 in which the reception frequency $f_e$ is converted, with a frequency $f_u$ of a tuning oscillator 2 into an output signal $f_a$ which is suitable for evaluation. The output signal $f_a$ can be supplied to the vertical deflection system of a cathode ray tube 6 by way of a transfer switch 3 and by way of two different modulator paths 4 and 5, respectively. The horizontal deflection system of the cathode ray tube 6 is connected to a sweep generator 7, for example, a sawtooth generator.

The tuning oscillator 2 can be tuned in terms of its output frequency $f_u$ by way of a control input 8 as a function of the d.c. voltage applied thereto. For operation as a sweeping oscillator, the sawtooth voltage of the sawtooth generator 7 is supplied to the control input 8 in the switch position v of an intervening electronic switch 9 and the oscillator is therefore periodically varied in its predetermined frequency range. In the switch position F (frequency analysis) of the switch 3, the entire signal spectrum 10 of the swept frequency is displayed on the screen of the cathode ray tube 6 during the sweep wave.

In the switch position r of the electronic transfer switch 9, the sweep generator 7 is switched off and the control loop 12 of a synthesizer, known per se, is closed by way of a line 11, the control loop having an adjustable frequency divider 13, a phase comparison element 14 and a reference frequency source 15. The division factor of the frequency divider 13 is adjusted in a manner known per se by means of a counter 16, namely, in accordance with the digital frequency setting by means of an adjustment knob 17. If the oscillator is to be set to an output frequency $f_u$ in the switch position r of the transfer switch 9, the output frequency $f_u$ corresponding to the n-fold multiple of a reference frequency $f_r$, then the division factor of the frequency divider 13 is correspondingly set to n by way of the counter 16 and the output frequency $f_u$ of the oscillator 2, thereby divided by n, is compared with the reference frequency $f_r$ in the phase comparison element 14. Given frequency and phase equality, the phase comparison device 14 supplies the tuning voltage U, corresponding to the frequency setting for the control loop 8 of the oscillator 2. The tuning voltage U is therefore directly proportional to the desired output frequency $f_u$ set at the adjustment knob 17 and the voltage U is therefore supplied to the storage capacitor 18 in the switch position r of the transfer switch 9 and is stored. When the oscillator 2 is again switched to sweep operation in the switch position v of the transfer switch 9, the tuning voltage U of the storage capacitor 18 can be compared in a voltage comparator 19 to the sawtooth voltage of the sawtooth generator 7. Given voltage equality, a keying pulse is generated at the output of the comparator 19 which generates an intensification pip 20 on the screen of the cathode ray tube 6, for example, by means of an appropriate control of the cathode beam. This intensification pip 20 can be displaced along the spectrum 10 by adjusting the tuning voltage U of the synthesizer with the adjustment knob 17.

The transfer of the electronic switch 9 between the switch position v and the switch position r, for example, can occur directly as a function of the sawtooth voltage of the sawtooth generator 7, as is indicated by means of the effective connection 21. During the leading portion V of the sawtooth voltage, the switch assumes the position v, and the switch position r during the return period R of the sawtooth voltage. Therefore, sweeping is carried out in periodic succession during the leading portion of the oscillator 2 and, therefore, the spectrum 10, together with the frequency mark 20, is displayed on the picture screen, whereas the control loop of the synthesizer is closed during the return which is carried out in retrace blanking and, therefore, the control voltage U corresponding to the frequency mark position is generated and stored.

However, the transfer switch 9 can also be controlled depending on the sawtooth generator 7 in such a manner that, for example, during every second, third or $n^{th}$ leading portion V, the switch assumes the position r, i.e. the sweep operation is briefly interrupted in selected leading portions and the comparison voltage U is instead obtained in the switch position r. This is particularly available given relatively high sweep frequencies in which such a brief blanking of the individual leading sweep portions has no further effect on the display.

The generation of the comparison voltage U for the frequency mark need not absolutely occur periodically; it suffices when, by means of a schematically indicated effective connection 22 between the frequency adjustment device 16, 17 of the synthesizer and of the electronic transfer switch 9, this is periodically switched between the switch position v and the switch position r only when a change of the frequency mark adjustment is undertaken, i.e. a change of the fixed frequency adjustment of the synthesizer. Upon determination of a change of the frequency mark, the switch 9 is brought into the switch position r, for example, at the next successive leading portion V of the sawtooth generator 7, and the voltage U corresponding to the new frequency setting is therefore stored and there is a transfer into the next successive leading portion back to sweep operation (switch position v).

The operating mode transfer switch 3 is likewise effectively coupled to the transfer switch 9. When the switch 3 is changed from the switch position F (frequency analysis and display of the entire spectrum 10 on the screen) into the switch position Z (time analysis) and, due to this switching operation, the transfer switch 9 is simultaneously also brought into the switch position r and held there, then the oscillator 2 supplies a fixed frequency $f_u$ which corresponds to the respective frequency setting of the synthesizer to the receiving portion 1 and, therefore, only the individual signal 23 of the frequency band is received which corresponds in terms of frequency to the position of the frequency mark 20 and can be evaluated by way of specially inserted modulation devices 5 or by way of further connectible receiving devices.

The standard phase comparison element 14 usually contains a corresponding storage capacitor at the output for the integration of the deviation voltages generated in successive phase comparison cycles, so that an additional storage capacitor 18 in the sense of the exemplary embodiment can be eliminated in these cases. The corresponding case applies to the synthesizers in which the phase comparison circuit 14 supplies a control voltage U corresponding to the most recently selected frequency setting, even given an interrupted control loop (switch position v). In this case, not only the capacitor 18 but, rather, the portion of the switch 9 arranged between the same and the phase comparison circuit 14 can also be eliminated.

Although I have described my invention by reference to particular illustrative embodiments thereof, many changes and modifications thereof may become apparent to those skilled in the art without departing from the spirit and scope of the invention. I therefore intend to include within the patent warranted hereon all such changes and modifications as may reasonably and properly be included within the scope of my contribution to the art.

I claim:

1. A device for inspecting an individual high frequency signal selected according to frequency from a broad frequency band, comprising:
a cathode ray tube including a beam generating system, first and second beam deflection systems and a picture screen;
input means including a converter for converting input signals to different frequency positions;
demodulator means connecting said input means to said first beam deflection system;
a sweep generator connected to said second deflection system for generating a periodic sweep voltage including a leading edge and a trailing edge;
a local oscillator, including a phase controlled oscillator connected to and swept across a frequency range by said sweep generator to cause a display of all signals occurring in the frequency band in a spectrum on said picture screen;
an adjustable frequency mark generator connected to said oscillator for generating a frequency mark voltage including a phase comparator, said frequency mark generator connected to said beam generating system to produce a mark which is adjustable on said picture screen to indicate a selected frequency;
storage means connected to said frequency mark generator; and
switching means connected between said sweep generator and said oscillator, and between said frequency mark generator and said oscillator and said storage means,
said switching means operable in a first mode to disconnect said sweep generator from said oscillator so that the instantaneous tuning voltage generated by said mark generator is stored in said storage means, and operable in a second mode to connect said sweep voltage to said local oscillator and to connect said storage means to said phase comparator to compare the sweep voltage of the generator with the tuning stored voltage,
said switching means being maintained in the first mode during inspection of the selected frequency.

2. The device of claim 1, wherein said frequency mark generator comprises:
a frequency divider connected to the output of said oscillator;
said phase comparator connected between said frequency divider and said switching means; and
a reference frequency oscillator connected to said phase comparator.

3. The device of claim 3, wherein said frequency mark generator further comprises:
a counter which is adjustable for setting the division ratio of said frequency divider.

4. The device of claim 3, wherein said frequency mark generator further comprises:
means for setting said counter so that said switchig means maintains said second mode when frequency mark adjustments are not being made.

5. The device of claim 1, comprising:
a plurality of different demodulators in said demodulating means; and
other switching means operable to select an appropriate demodulator with respect to frequency analysis and time analysis.

6. A device for inspecting an individual high frequency signal selected according to frequency from a broad frequency band, comprising:
a cathode ray tube having a picture screen;
a sweep generator connected to said cathode ray tube for generating and providing thereto a periodic sweep voltage;
a converter including a signal input for receiving input signals, said converter connected to said cathode ray tube;
a voltage-controlled local oscillator connected to said converter and producing an output frequency by which the input signals of said converter are converted in frequency according to the heterodyne principle to cause a display of all signals occurring in the frequency band in a spectrum on said picture screen, said oscillator including a control input;
a phase lock loop including a phase comparator connected to receive a frequency representing the output frequency of said oscillator and comparing the same to a reference frequency, said phase lock loop connectible to said control input of said oscillator;

means connected to said phase comparator for storing the output voltage thereof;

a voltage comparator connected to said cathode ray tube for producing a frequency mark on said picture screen; and switching means for selectively connecting said control input of said oscillator to said sweep generator or to said phase lock loop, said switching means operable in a first mode to disconnect said sweep generator from said oscillator and to close said phase lock loop and to store the instantaneous tuning voltage of said phase comparator in said storage means, and operable in a second mode to separate said phase lock loop and to connect said sweep generator to said oscillator and compare said stored tuning voltage of said phase comparator with the sweep voltage of said sweep generator for producing a frequency mark on said picture screen corresponding to the frequency setting of the oscillator in the first mode.

7. The device of claim 6, wherein: said switching means comprises means operable to maintain said first mode thereof during the trailing portion and said second mode thereof during the leading portion of the sweep voltage.

8. The device of claim 6, wherein: said switching means comprises means operable to maintain said first mode during every $n^{th}$ leading portion and said second mode during the intervening leading portions of the sweep voltage.

9. The device of claim 6, and further comprising:

means operable to control said switching means for transfer between said first mode and said second mode only after an alteration of the frequency mark setting.

10. The device of claim 6, wherein: said switching means comprises electronic switching means.

* * * * *